(12) United States Patent
Ban et al.

(10) Patent No.: US 9,209,756 B2
(45) Date of Patent: Dec. 8, 2015

(54) OPTICAL RECEIVER MODULE INCLUDING A THIN FILM RESISTOR PARALLEL CONNECTED TO A BIAS PAD

(71) Applicant: Oclaro Japan, Inc., Kanagawa (JP)

(72) Inventors: Takuma Ban, Kanagawa (JP); Yoichiro Igarashi, Tokyo (JP)

(73) Assignee: OCLARO JAPAN, INC., Kanagawa (JP)

( * ) Notice: Subject to any disclaimer, the term of this patent is extended or adjusted under 35 U.S.C. 154(b) by 79 days.

(21) Appl. No.: 14/224,638

(22) Filed: Mar. 25, 2014

(65) Prior Publication Data

US 2015/0270814 A1  Sep. 24, 2015

(30) Foreign Application Priority Data

Mar. 28, 2013  (JP) ................................. 2013-069668

(51) Int. Cl.
*G02B 27/00* (2006.01)
*H03F 3/08* (2006.01)

(52) U.S. Cl.
CPC ........................................ *H03F 3/08* (2013.01)

(58) Field of Classification Search
CPC ..................... H01L 29/4908; H01L 27/14692; H01L 31/02162
USPC ............ 250/551, 214 R, 214.1, 239, 214 LA; 257/290–292, 440–444
See application file for complete search history.

(56) References Cited

U.S. PATENT DOCUMENTS 8,987,650 B2 *  3/2015  Ito et al. .................... 250/214 A
2003/0081297 A1  5/2003  Hasegawa et al.

FOREIGN PATENT DOCUMENTS

| JP | 2003-134051 A | 5/2003 |
| JP | 2005-108935 A | 4/2005 |
| JP | 2007-242708 A | 9/2007 |

* cited by examiner

*Primary Examiner* — Que T Le
(74) *Attorney, Agent, or Firm* — Mattingly & Malur, PC

(57) ABSTRACT

An optical receiver module includes a light receiving element that converts a received light signal into an electric signal, a bias pad supplied with a bias power. The bias pad is included in the light receiving element and/or a carrier on which the light receiving element is mounted. The optical receiver module also includes a thin film resistor arranged in contact with the bias pad so as to connect in parallel to the bias pad. An electric resistance of the thin film resistor is larger than an electric resistance of the bias pad. The optical receiver module further includes an amplifier that amplifies the electric signal.

9 Claims, 19 Drawing Sheets

OPTICAL RECEIVER MODULE INCLUDING A THIN FILM RESISTOR PARALLEL CONNECTED TO A BIAS PAD

CROSS-REFERENCE TO RELATED APPLICATION

The present application claims priority from Japanese Application JP2013-69668, the content to which is hereby incorporated by reference into this application.

BACKGROUND OF THE INVENTION

1. Field of the Invention

The present invention relates to an optical receiver module.

2. Description of the Related Art

In recent years, an optical receiver module having a transmission speed of about 10 Gbps is generally shaped into a coaxial package or a box package. A light receiving element and a transimpedance amplifier are proximally included in the package. Also, a lens is mounted on the package, and a light signal input through a fiber is converted into an electric signal through an absorption layer (light receiving portion) of the light receiving element by photoelectric conversion after a beam spot has been narrowed by the lens. The electric signal is as weak as about several microamperes to several milliamperes, and therefore amplified by the transimpedance amplifier, and output as a voltage signal.

Also, a bias to be applied to the light receiving element, and a power supply to be supplied to the transimpedance amplifier are arranged outside of the package. In a high-speed optical receiver module of 10 Gbps or more, in order to prevent generation of noise and signal deterioration caused by oscillation, the bias and a power line are designed to pass through an electrode pad such as a plate capacitor or a chip capacitor within the package.

An electric connection between an interior and an exterior of the package is conducted by a read pin attached to the package, or a transmission line pattern wired on a ceramic substrate. This optical receiver module is disclosed in JP 2003-134051 A, JP 2005-108935 A, and JP 2007-242708 A.

In general, it is desirable that in the optical receiver module, for example, a resonance causing malfunction is suppressed, and peaking and dipping are reduced to flatten the transmission characteristic as much as possible. In order to flatten the transmission characteristic as much as possible, for example, JP 2003-134051 A, JP 2005-108935 A, and JP 2007-242708 A disclose that a resistance thin film or a resistance element is inserted in series between lines for supplying a bias or signal lines which are patterned on a carrier (metallization substrate).

SUMMARY OF THE INVENTION

However, when the resistance thin film or the resistance element is inserted in series between the signal lines or the like as described above, a cutoff frequency (transmission band) drops. The cutoff frequency drop is caused by a physical law (the cutoff frequency is inversely proportional to a capacity and a resistance) called "CR time constant", and therefore cannot be prevented. That is, in the optical receiver module of 10 Gbps or more, particularly in the optical receiver module having a transmission capacity of 25 Gbps, 40 Gbps, or 50 Gbps, which is expected to increase in demand in recent years, the above method cannot be applied.

In view of the above, one or more embodiments of the present invention is to provide an optical receiver module having a high-speed transmission capacity, which reduces peaking and dipping, and has a high-quality transmission characteristic.

(1) In one or more embodiments of the present invention, an optical receiver module includes a light receiving element that converts a received light signal into an electric signal, a bias pad supplied with a bias power. The bias pad is included in the light receiving element and/or a carrier on which the light receiving element is mounted. The optical receiver module also includes a thin film resistor arranged in contact with the bias pad so as to connect in parallel to the bias pad. An electric resistance of the thin film resistor is larger than an electric resistance of the bias pad. The optical receiver module further includes an amplifier that amplifies the electric signal.

(2) In the optical receiver module of (1), the thin film resistor is disposed in an outer periphery of the bias pad to contact with the bias pad.

(3) In the optical receiver module of (1), the optical receiver module further includes a pad arranged to contact with the thin film resistor without contacting with the bias pad. A resistance value of the pad is smaller than a resistance value of the thin film resistor.

(4) In the optical receiver module of (1), the thin film resistor is arranged so that an end of the bias pad contacts with the thin film resistor.

(5) In the optical receiver module of (1), the thin film resistor is arranged so that an end of the bias pad overlaps with the thin film resistor.

(5) In the optical receiver module of (1), the thin film resistor is disposed to contact with the bias pad included in the carrier.

(7) In the optical receiver module of (1), the thin film resistor is disposed to contact with the bias pad included in the light receiving element.

(8) In the optical receiver module of (1), the bias power is supplied to the bias pad through a wire.

(9) In the optical receiver module of (1), the amplifier is any one of a transimpedance amplifier, a preamplifier, a limiting amplifier, and an automatic gain controller.

DETAILED DESCRIPTION OF THE INVENTION

Figure 1:
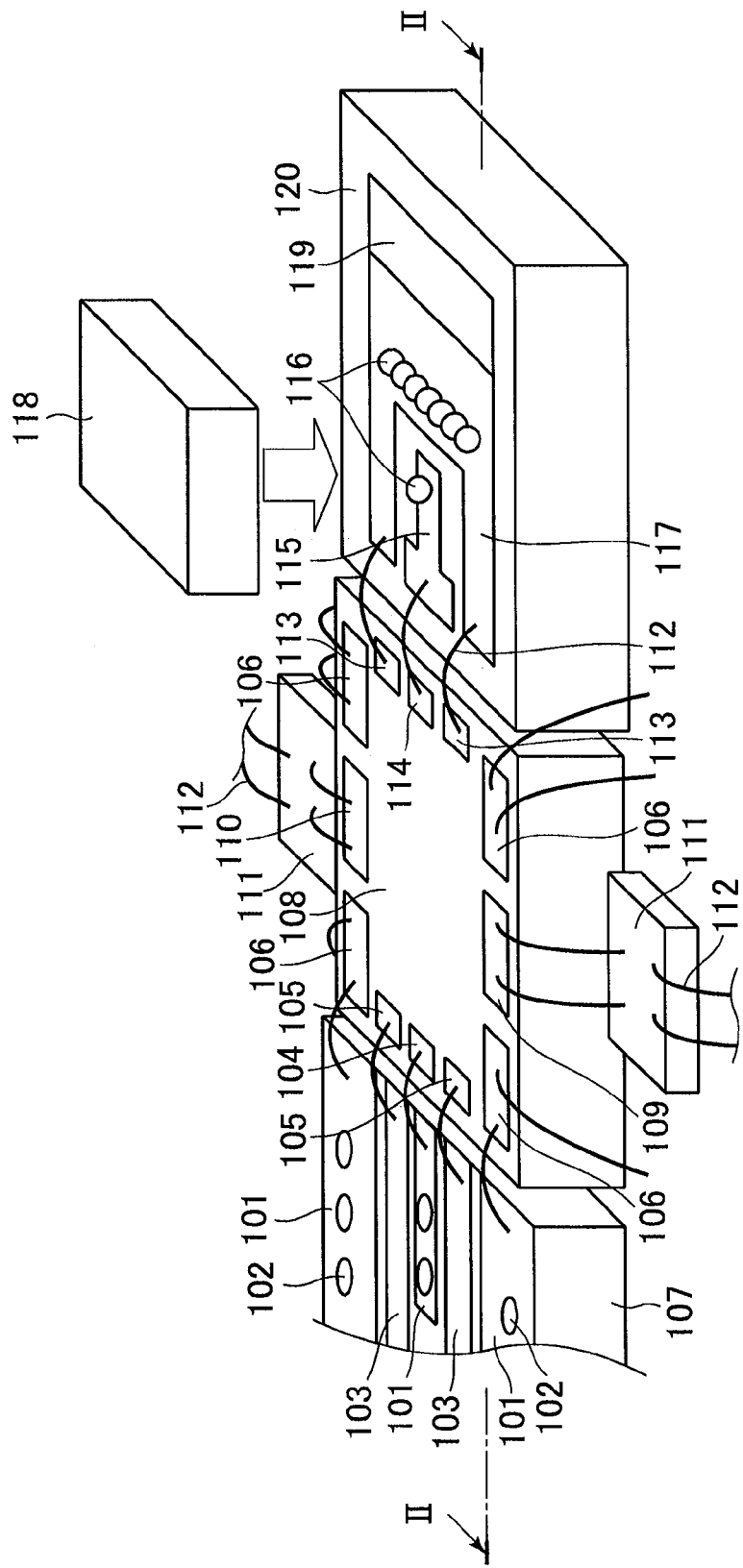
FIG. 1 is a diagram illustrating an outline of a first embodiment of the present invention.

Hereinafter, embodiments of the present invention will be described with reference to the accompanying drawings. In the drawings, identical or equivalent elements are denoted by the same symbols, and a repetitive description will be omitted.

First Embodiment

Figure 2:
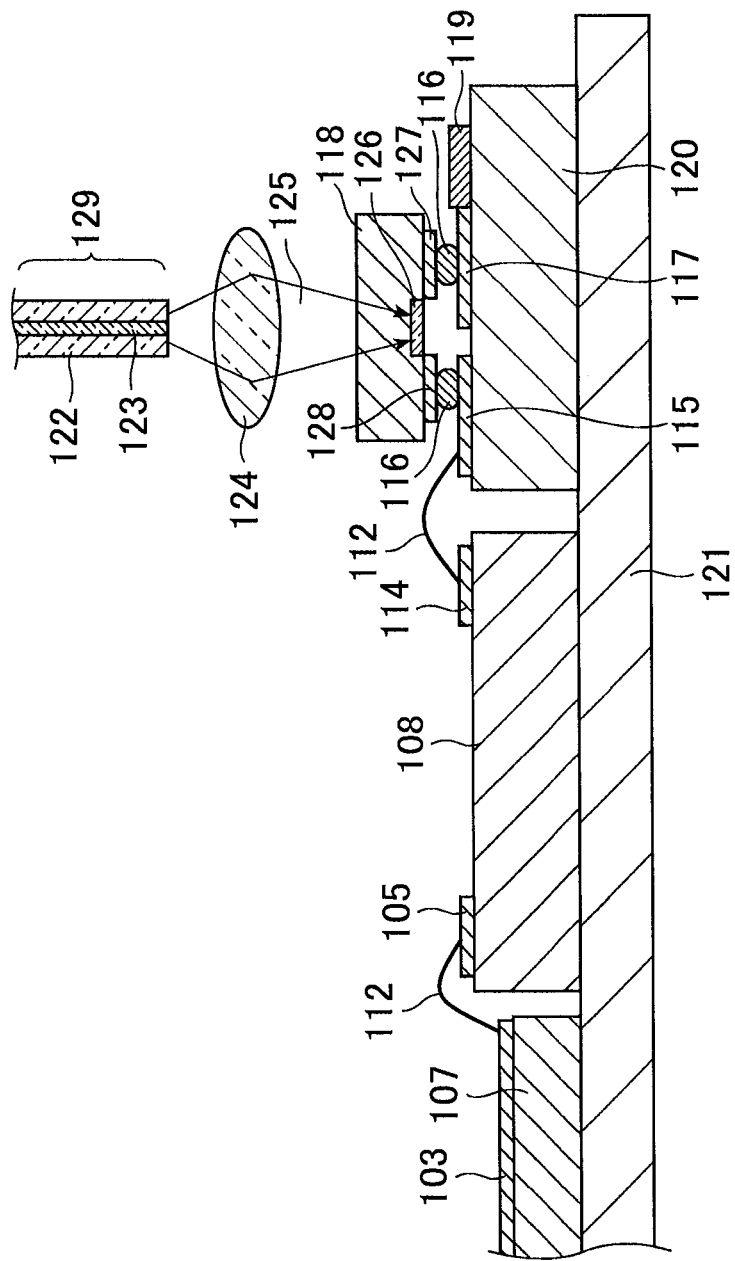
FIG. 2 is a diagram illustrating an outline of a cross-section I-I in FIG. 1.

FIG. 1 is a diagram illustrating an outline of a first embodiment of the present invention. Also, FIG. 2 is a diagram illustrating an outline of a cross-section I-I in FIG. 1. In this example, FIG. 1 illustrates a diagram before a light receiving element 118 is mounted on pads 115 and 117 through solders 116. A configuration illustrated in FIGS. 1 and 2 are exemplary, and this embodiment is not limited to this configuration.

As illustrated in FIGS. 1 and 2, an optical receiver module 100 mainly includes the light receiving element 118, a carrier 120 on which the light receiving element 118 is mounted, a transimpedance amplifier 108, and a substrate 107. A light signal 125 is output through a fiber core layer 123 within an optical fiber 129, focused by a lens 124, and input to an absorption layer 126 formed on the light receiving element 118. The light receiving element 118 illustrated in FIGS. 1 and 2 is a back surface illuminated type light receiving element in which the light signal 125 passes through the light receiving element 118, and enters the absorption layer 126.

The light receiving element 118 is made of a semiconductor material such as gallium arsenide, indium phosphide, silicon, or silicon germanium, and the material to be used is different depending on a use waveform or a transmission capacity (communication speed). The material configuring the light receiving element 118 may be different from the above materials, and may be a composite material thereof.

The light signal 125 input to the absorption layer 126 of the light receiving element 118 is converted into an electric signal. The electric signal is input to an amplifier (not shown) formed on the transimpedance amplifier 108 sequentially through a signal pad 128 formed on the light receiving element 118, the signal pad 115 on the carrier 120, and a signal pad 114 on the transimpedance amplifier 108.

The signal pad 128 and the signal pad 115 are electrically and mechanically connected to each other. Specifically, for example, the signal pad 128 and the signal pad 115 are connected to each other by, for example, the solder 116. Also, the signal pad 115 and the signal pad 114 are electrically and mechanically connected to each other by bonding through a wire 112.

A bias power is supplied to the light receiving element 118. Specifically, for example, the bias power is supplied from an external power line (not shown) to a bias pad 109 through an electrode on a plate capacitor 111 by the wire bonding 112. A bias power line (not shown) is patterned on the trans impedance amplifier 108, and the bias power is supplied to a bias pad 113 through the bias power line. That is, the bias power is supplied to the absorption layer 126 through the wire bonding 112, the bias pad 117, the solders 116, and a bias pad 127 in the stated order.

The power of the transimpedance amplifier 108 is supplied to a signal amplifier circuit (not shown) on the transimpedance amplifier 108 from an external line (not shown) through an electrode (not shown) on the plate capacitor 111, and a power pad 110 via the wire 112.

The bias power of the light receiving element 118 may be supplied from the power of the transimpedance amplifier 108. Also, a bias power supply method to the light receiving element 118 is generally different depending on manufacturers that manufacture the transimpedance amplifier 108.

The transimpedance amplifier 108 amplifies the electric signal input from the signal pad 114, and outputs the electric signal to signal pads 105. The two signal pads 105 are provided because differential output is conducted. Then, the differentially output signal is output to an external of the optical receiver module 100 through a signal pattern 103 on the substrate 107.

The carrier 120 includes the signal pad 115, the bias pad 117, and a thin film resistor 119 on a surface thereof. It is preferable that the carrier 120 is made of ceramic of 1 MΩm or higher such as alumina, aluminum nitride, glass, or quartz.

The signal pad 115 is arranged, for example, in a substantially center of the transimpedance amplifier 108 side. The bias pad 117 is arranged so as to surround the signal pad 115 along an outer periphery of the signal pad 115. Also, the thin film resistor 119 is arranged on the bias pad 117 so as to contact with at least a part of an outer periphery of the bias pad 117. That is, the thin film resistor 119 is arranged so that the bias pad 117 and the thin film resistor 119 have a parallel connection relationship.

FIG. 1 illustrates an example in which the thin film resistor 119 is arranged to cover one side of the bias pad 117 at an opposite side to the transimpedance amplifier 108. The thin film resistor 119 may be arranged different in position, shape, and size from that of FIG. 1 so far as the thin film resistor 119 is arranged so as to contact with at least a part of the outer periphery of the bias pad 117. Further, the bias power may be configured to be supplied to the bias pad from not the transimpedance amplifier 108 but the external. Specifically, for example, as illustrated in FIG. 3, a thin film resistor 1110 may be arranged to contact with a part of the side opposite to a capacitor 1114.

Subsequently, a description will be given of a flow in the current around the bias pad when the high frequency light signal of several GHz or more is input to the light receiving element 118 with reference to FIG. 3. When the high frequency light signal of several GHz or more is input to the light receiving element 118, the light receiving element 118 tries to draw a current corresponding to the frequency from a bias pad 1111. In this situation, the high frequency signals flow along an outer periphery and an inner periphery of the bias pad 1111. That is, referring to FIG. 3, the respective high frequency signals flow along a first current path 1112 and a second current path 1113.

Figure 3:
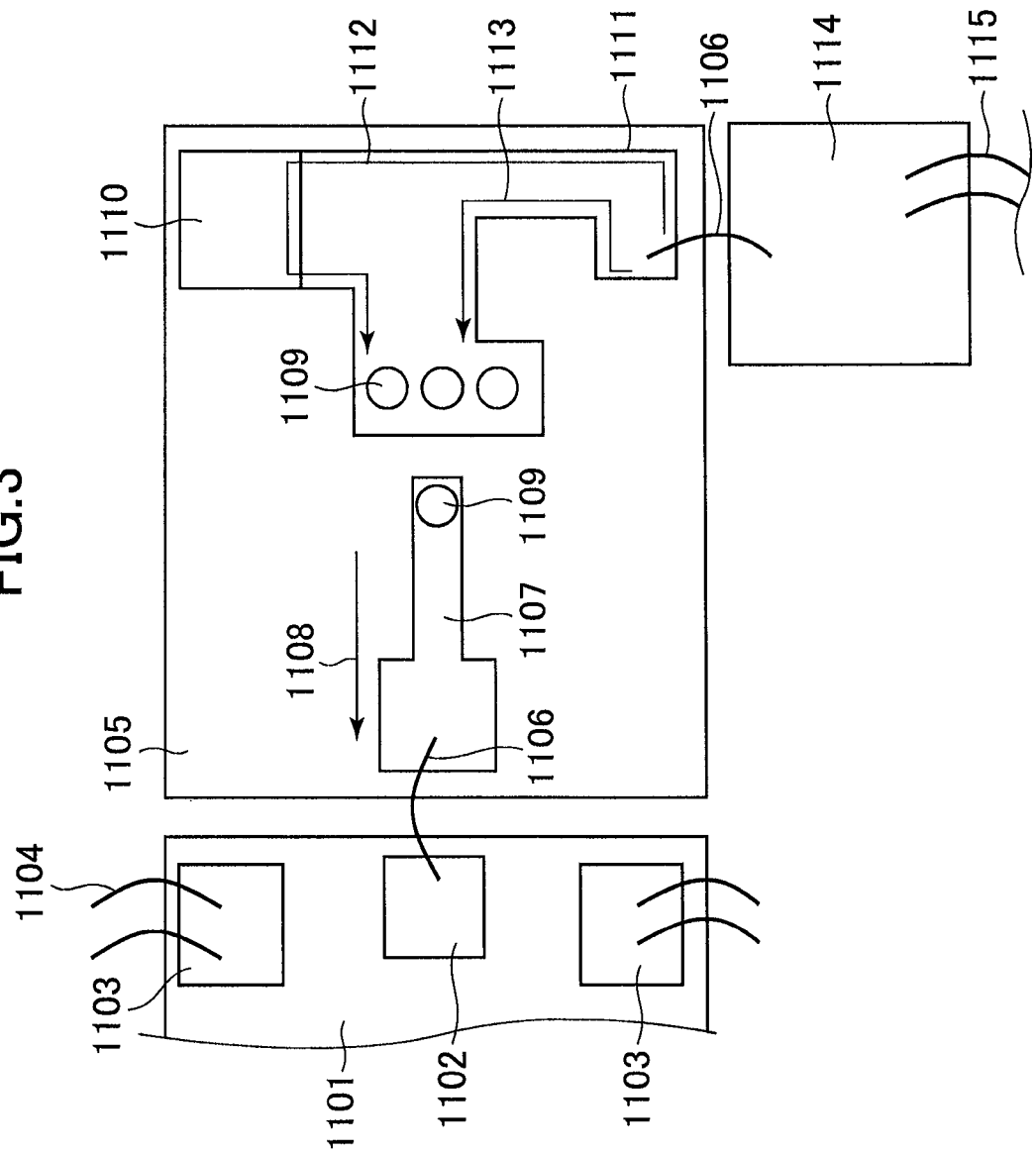
FIG. 3 is a diagram illustrating an example in which a thin film resistor is arranged at an opposite side to a capacitor.

As illustrated in FIG. 3, the first current path 1112 is longer than the second current path 1113. For that reason, when the high frequency current passing through the first current path 1112 resonates, an electromagnetic radiation occurs on a lower frequency side. For example, when the high frequency current passing through the second current path 1113 resonates at 30 GHz, there occurs a phenomenon that the high frequency current passing through the first current path 1112 resonates at 20 GHz.

In recent years, in the optical receiver module of the transmission capacity 25 Gbps, which is used for 100 Gbps transmission, the resonance on the lower frequency side causes the performance deterioration. Under the circumstances, the thin film resistor 1110 is disposed to contact with a part of an outer periphery of the bias pad 1111, that is, at least a part of an outer periphery (first current path 1112) of the bias pad 1111 on a side where the current path is longer, thereby being capable of suppressing resonance on the lower frequency side. The resonance can be suppressed as described above with reference to FIG. 3, the same is applied to FIGS. 1 and 2. The details of the above effect will be described later.

Figure 4:
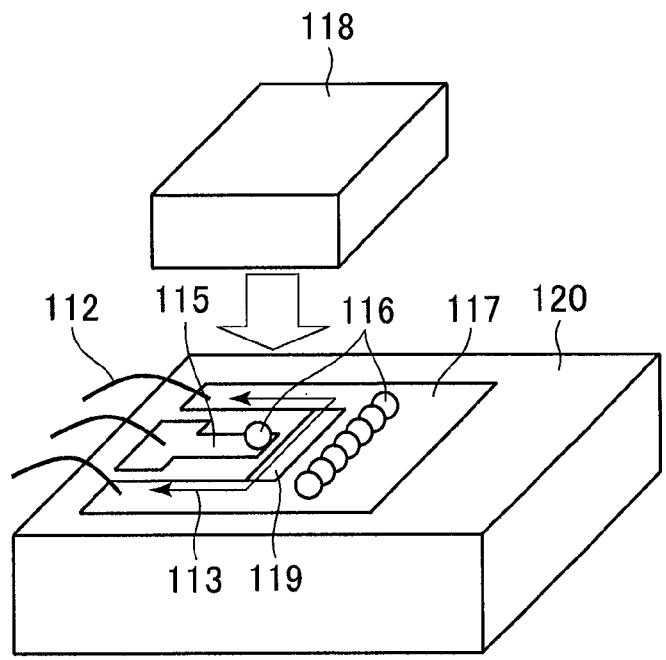
FIG. 4 is a diagram illustrating an example in which the thin film resistor is arranged in contact with an inner periphery of a bias pad.

For example, as illustrated in FIG. 4, the thin film resistor 119 may be arranged to come contact with an inner periphery of the bias pad 117. However, it is more desirable that the thin film resistor is disposed on at least a part of the outer periphery of the bias pad as described above. For example, this is because pattern codes used for optical communication require a broadband transmission capacity required from a low frequency to a determined frequency, and the resonance at the lower frequency side is preferably suppressed as described above.

Figure 5:
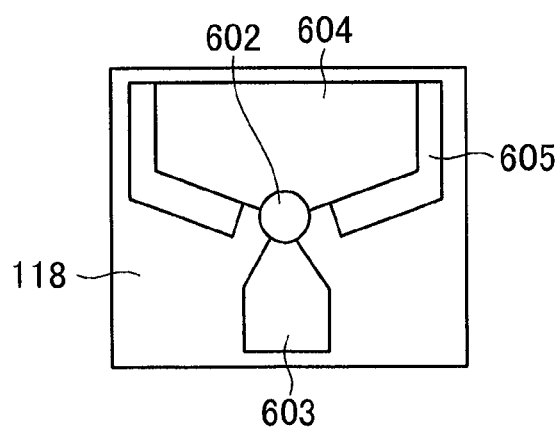
FIG. 5 is a diagram illustrating an example in which the thin film resistor is arranged in contact with the bias pad of a light receiving element.

Also, the thin film resistor 119 may be disposed in a part of the outer periphery of the bias pad arranged in the light receiving element 118. For example, as illustrated in FIG. 5, in addition to the thin film resistor 119, a thin film resistor 605 may be disposed to contact with a part of the outer periphery of a bias pad 604 formed on a surface (rear surface) of the light receiving element 118 which is installed on the carrier 120. Specifically, for example, two thin film resistors 605 are arranged on both sides of a light receiving unit 602 (it is also referred to as an absorption layer) so as to come contact with the outer periphery of the bias pad 604. Also, in this embodiment, only any one of the thin film resistor 119 on the carrier 120 and the thin film resistor 605 disposed on the light receiving element 118 may be disposed, or both thereof may be disposed at the same time. If any one of those thin film resistors is provided, resonance can be suppressed.

In the above case, as illustrated in FIG. 5, an absorption layer 602, the bias pad 604, and a signal pad 603 are disposed on the rear surface of the light receiving element 118. Then, as described above, the thin film resistor 605 may be disposed to contact with a part of the outer periphery of the bias pad 604. The bias power is supplied from the bias pad 604, and converted from the light signal into the electric signal in the absorption layer 602. Also, the electric signal is output from the signal pad 603. When the light receiving element 118 is mounted on the carrier 120, for example, the signal pad 115 and the bias pad 117 of the carrier 120 are connected to the signal pad 603 and the bias pad 604 of a light receiving element 601 by the solders 116, respectively.

Figure 6:
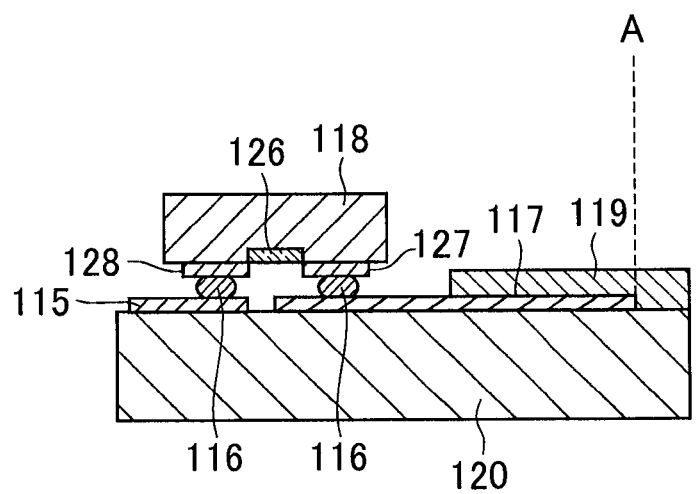
FIG. 6 is a diagram illustrating an example of a positional relationship between the thin film resistor and the bias pad.
Figure 7:
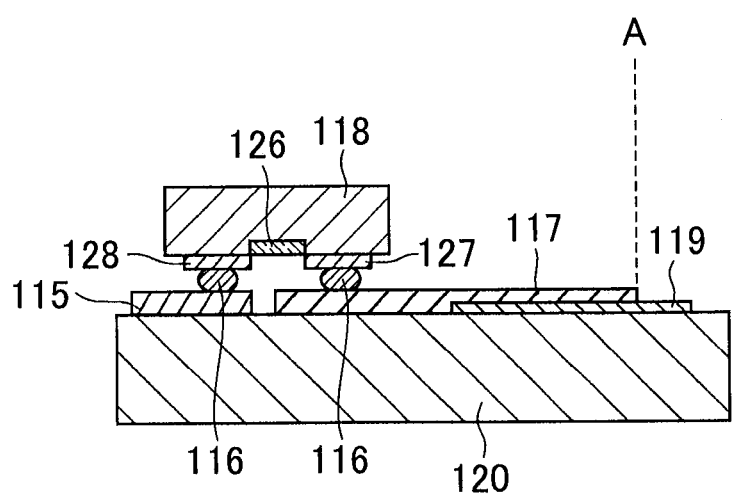
FIG. 7 is a diagram illustrating another example of a positional relationship between the thin film resistor and the bias pad.

Subsequently, an arrangement of the thin film resistor 119 and the bias pad 117 in cross-section will be described in more detail. For example, as illustrated in FIG. 6 or 7, the thin film resistor 119 is arranged to contact with an end of the bias pad 117 (portion indicated by A in the figure). More specifically, as illustrated in FIG. 6, the thin film resistor 119 is arranged to overlap with the end of the bias pad 117. Alternatively, for example, as illustrated in FIG. 7, the bias pad 117 is arranged to overlap with the thin film resistor 119 so that the end of the bias pad 117 is located on the thin film resistor 119. As illustrated in FIG. 2, the end of the bias pad 117 and the end of the thin film resistor 119 may be arranged to contact with each other so that the bias pad 117 does not overlap with the thin film resistor 119.

As described above, the end of the bias pad 117 is arranged to contact with the thin film resistor 119. With this arrangement, when a high frequency electric (current) signal flows into the bias pad 117, an electromagnetic field of the high frequency escaping from the end of the bias pad 117 is attenuated by a skin effect, and the resonance at the bias pad can be suppressed.

Also, an electric resistance of the thin film resistor 119 is set to be larger than an electric resistance of the bias pad 117. For example, a surface of the bias pad 117 is made of metal (for example, Au) which is small in the electric resistance, and the thin film resistor 119 is formed of a compound of Ni and Cr, a compound of Ta and N, or a material such as Ti or No of which resistances is larger than Au. For example, a compound of Ni and Cr, a compound of Ta and N, or a material such as Ti or No may be patterned at positions of the bias pad 117 and the thin film resistor 119, and a portion of the bias pad 117 may be plated with metal (for example, gold, aluminum, platinum, or silver) which is, for example, 100 nΩm or lower in the electric resistance from above the patterned portion.

As described above, since the electric resistance of the thin film resistor 119 is larger than the electric resistance of the bias pad 117, most of a DC current (DC) passes through the bias pad 117, and flows up to the absorption layer 126. However, in the high frequency band, a current also flows into the thin film resistor 119. As a result, the resonance suppression or the noise reduction can be conducted in the high frequency band. The resonance suppression or the noise reduction will be described in more detail with reference to an equivalent circuit simplifying the periphery of the carrier 120 and the transimpedance amplifier 108 illustrated in FIGS. 1 and 2.

Figure 8:
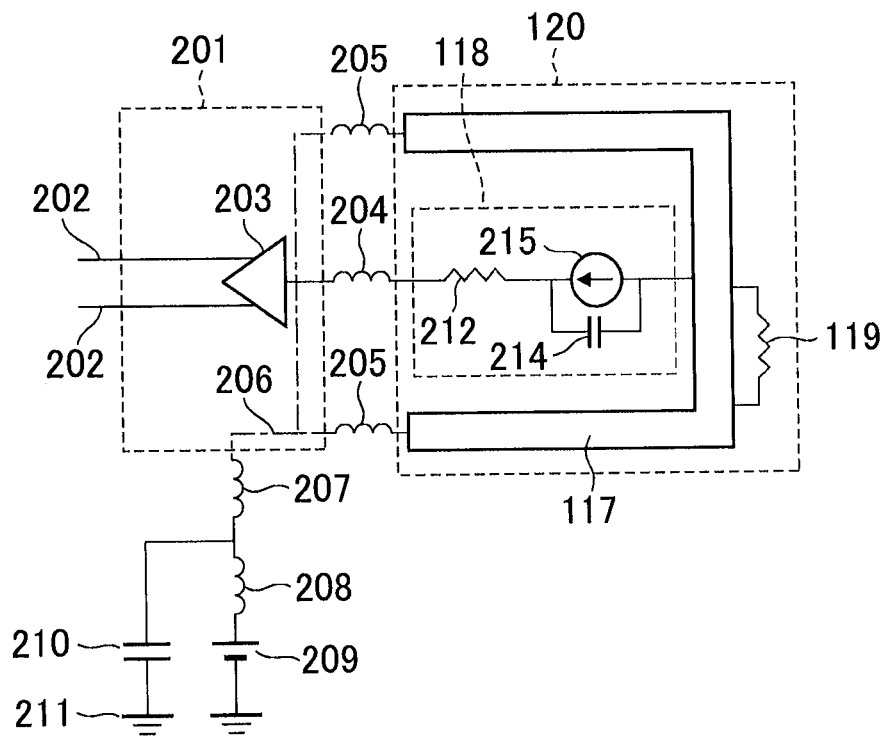
FIG. 8 is a diagram illustrating an equivalent circuit in the periphery of a carrier and a transimpedance amplifier illustrated in FIG. 1.

FIG. 8 is a diagram illustrating an equivalent circuit of the periphery of the carrier and the transimpedance amplifier illustrated in FIG. 1. For facilitation of understanding, the equivalent circuit is simplified.

It is conceivable that the light receiving element 118 includes a current source 215 that outputs a current proportional to the received light, an internal capacity 214, and an internal resistor 212. Hence, in FIG. 2, the light receiving element 118 is represented by the current source 215, the internal capacity 214, and the internal resistor 212. Also, the transimpedance amplifier 108 in FIGS. 1 and 2 corresponds to an amplifier circuit 203 and an output line 202 in FIG. 8. Also, the plate capacitor 111 in FIGS. 1 and 2 corresponds to a capacitor 210. Also, the wire 112 corresponds to a signal wire 204, and bias wires 207, 208.

As illustrated in FIG. 8, the signal pad (not shown) and the bias pad 117 on the carrier 120 are connected to the signal pad (not shown) and the bias pad (not shown) on the transimpedance amplifier 108 by the signal wire 204 and a bias wire 205, respectively. A filter may be disposed in a bias line 206 within a transimpedance amplifier 201. Also, a drawing method is different depending on the respective manufacturers.

In this example, the frequency characteristic of the above equivalent circuit is affected by a performance of the amplifier circuit 203, and a carrier travel time of the light receiving element 118, and also largely affected by the bias wire inductance 205, the internal capacity 214, the internal resistor 212, and the signal wire inductance 204.

Specifically, a cutoff frequency F of the equivalent circuit is represented as follows.

$$F=1/(2*pi*C*R) \quad (C: \text{capacitance}, R: \text{resistance}) \qquad (1).$$

In this example, C and R are a capacitance and a resistance of a current path going out of the bias line 206 and coming into the amplifier circuit 203. As is understood from Expression (1), as C and R are smaller, the cutoff frequency F becomes larger, and the transmission band becomes broader.

The current source 215 tries to draw a current corresponding to the frequency of a received light signal from the bias pad 117. However, because the bias wire inductance 205 is provided between the bias pad 117 and the bias pad (not shown) of the transimpedance amplifier 108, a potential difference is generated between the bias line 206 and the bias pad 117. In this case, the bias pad 117 may resonate at a specific frequency according to a shape and a length thereof. The resonance on the bias pad 117 induces the deterioration of a signal to be input to the amplifier circuit 203.

In this example, the resonant frequency is generally a high frequency of several GHz to several tens GHz. Those high frequencies are localized in the periphery of the bias pad 117 by a physical phenomenon generally called "skin effect". Under the circumstances, according to this embodiment, the thin film resistor 119 is connected in parallel to the bias pad 117 as described above. Therefore, the high frequency current slightly flows into the thin film resistor 119, and a resonance efficiency is reduced. As a result, the deterioration of the signal can be suppressed.

Subsequently, the effects of this embodiment will be described in more detail with the use of simulation results with reference to FIGS. 9 to 11. An electromagnetic simulator HFSS made by ANSYS Inc. is used for the simulation.

Figure 9:
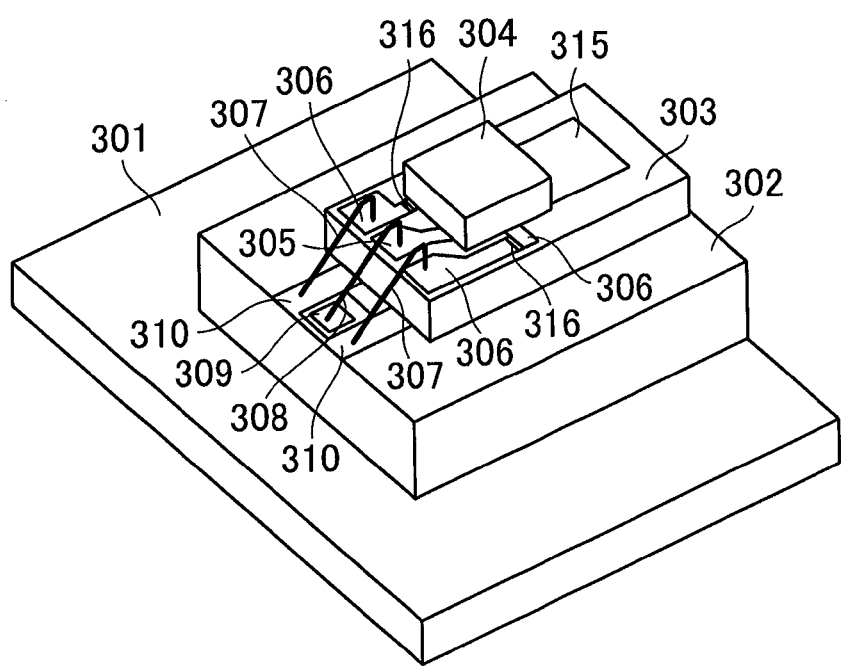
FIG. 9 is a diagram illustrating simulation according to this embodiment.

In this simulation, as illustrated in FIG. 9, a transimpedance amplifier 302 is mounted on a package substrate 301, and a light receiving element 304 is mounted on the transimpedance amplifier 302. In this way, the configuration of FIG. 9 is different from that of FIG. 1 in that the light receiving element 304 is mounted on the transimpedance amplifier 302. However, the configurations of FIGS. 1 and 9 are substantially identical with each other, and there arises no problem to compare the performance regardless of whether a thin film resistor 315 is provided on a carrier 303. Also, in FIG. 9, resistance patterns 316 are inserted between bias pads 306. This is because disadvantages in a method of the related art are described, and the results will be described later. It is needless to say that this embodiment may be applicable to the configuration illustrated in FIG. 9, not in that in FIG. 1.

Figure 10A:
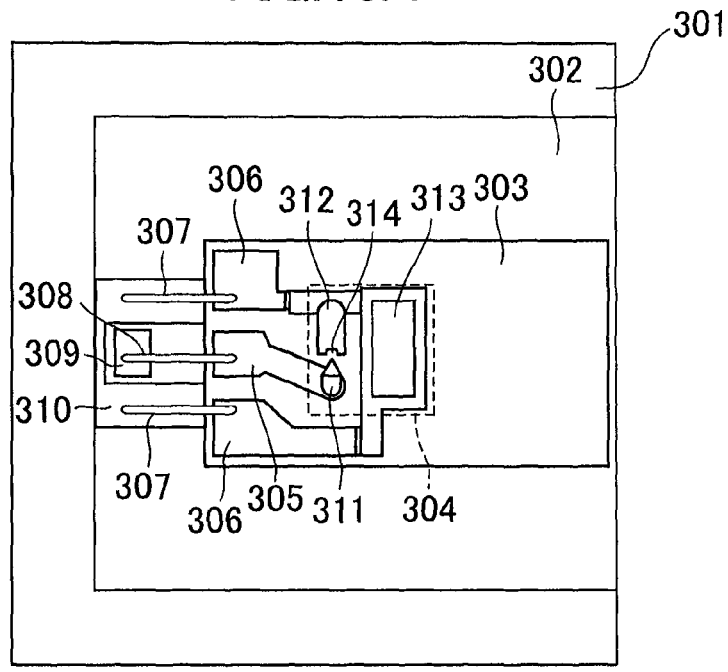
FIG. 10A is a diagram illustrating a comparative example with this embodiment.
Figure 10B:
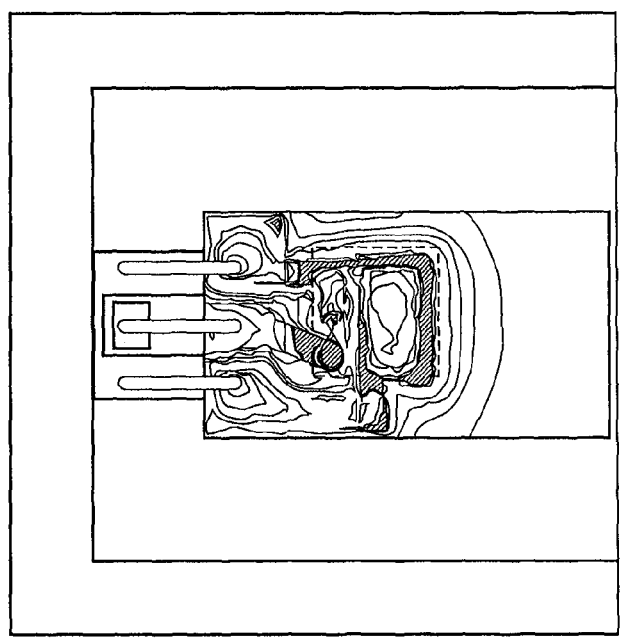
FIG. 10B is a diagram illustrating a comparative example with this embodiment.

FIGS. 10A and 10B are diagrams illustrating electromagnetic field distributions on the carrier corresponding to a case in which the thin film resistor is not provided. As illustrated in FIG. 10A, the thin film resistor 315 is not disposed on the carrier 303. FIG. 10B illustrates an electromagnetic field distribution on an upper surface of the carrier 303 when the package substrate 301 is viewed in a case illustrated in FIG. 10A. FIGS. 10A and 10B are plan views in which FIG. 9 is viewed from above.

In the above simulation, the resistance patterns 316 are set to 0Ω. Also, the signal to be input to the light receiving unit is set to 32.4 GHz. For facilitation of understanding, in FIGS. 10A and 10B, the light receiving element 304 is transparently represented.

As illustrated in FIG. 10B, when the thin film resistor 315 is not provided, if the light signal is input to a light receiving unit 314, the bias pads 306 oscillate. Specifically, for example, shaded portions in FIG. 10B represent an electromagnetic field that flies out toward the air. The resonant electromagnetic field concentrates in not an inner periphery but an outer periphery of the bias pads 306. This represents a phenomenon that the high frequency current flows in the outer periphery of the bias pads, which is called "skin effect". The resonating electromagnetic field may fly out toward the air from the bias pads 306, fly within the package of the optical receiver module, and induce the malfunction of the transimpedance amplifier 302.

Figure 11A:
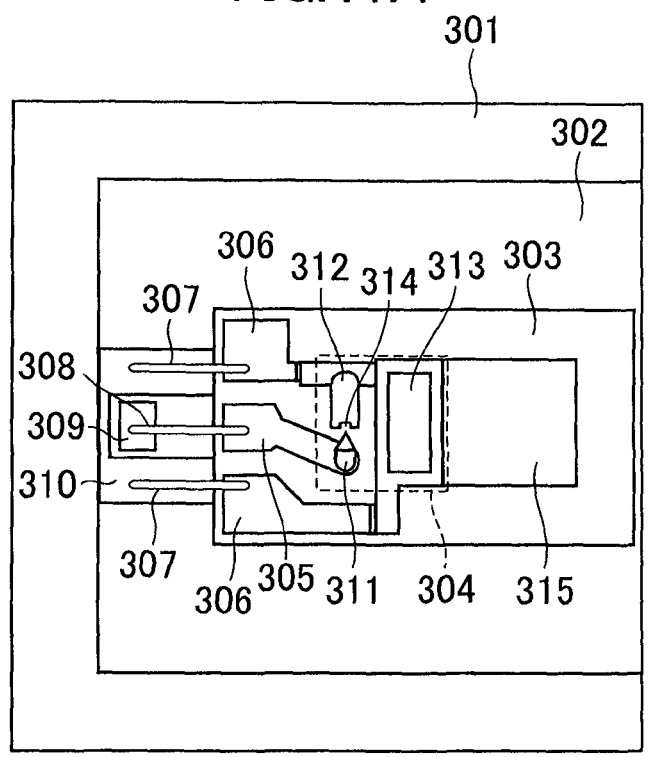
FIG. 11A is a diagram illustrating simulation according to this embodiment.
Figure 11B:
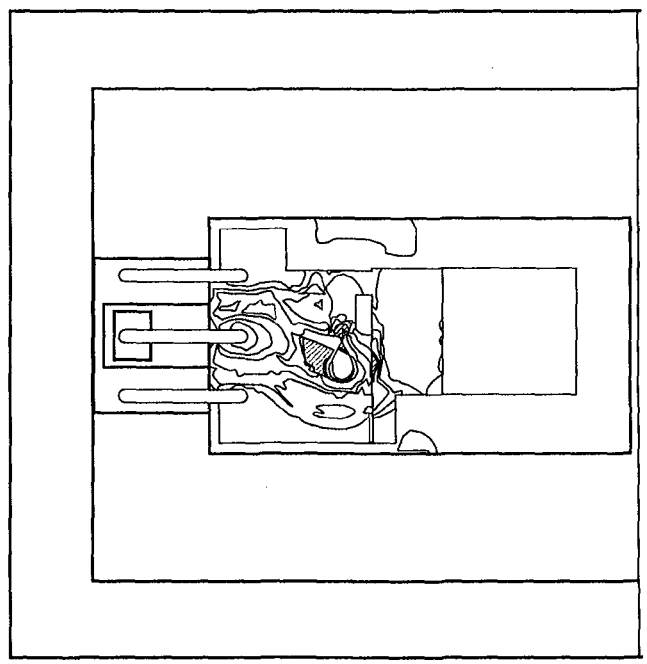
FIG. 11B is a diagram illustrating simulation according to this embodiment.

FIG. 11A is a diagram illustrating an electromagnetic field distribution on the carrier 303 corresponding to a case in which the thin film resistor 315 is disposed in this embodiment. Specifically, in the simulation, as illustrated in FIG. 11A, the thin film resistor 315 (270 μm×300 μm) is arranged to contact with the bias pads 306 on the carrier 303. Also, the resistant value is a value indicative of 100Ω in a square of 1 cm². Also, the input light signal is 32.4 GHz.

The resonance flowing in the bias pads 306 is suppressed, and the electric signal flows in a signal pad 305. That is, as understood from a comparison between FIGS. 10B and 11B, normal operation is conducted while the electromagnetic field does not fly out into the air. Specifically, when the high frequency current of 32.4 GHz flows in the ends of the bias pads 306, the current slightly flows into the thin film resistor 315. As a result, the resonance efficiency is remarkably degraded, and the deterioration of the signal is suppressed.

Figure 12:
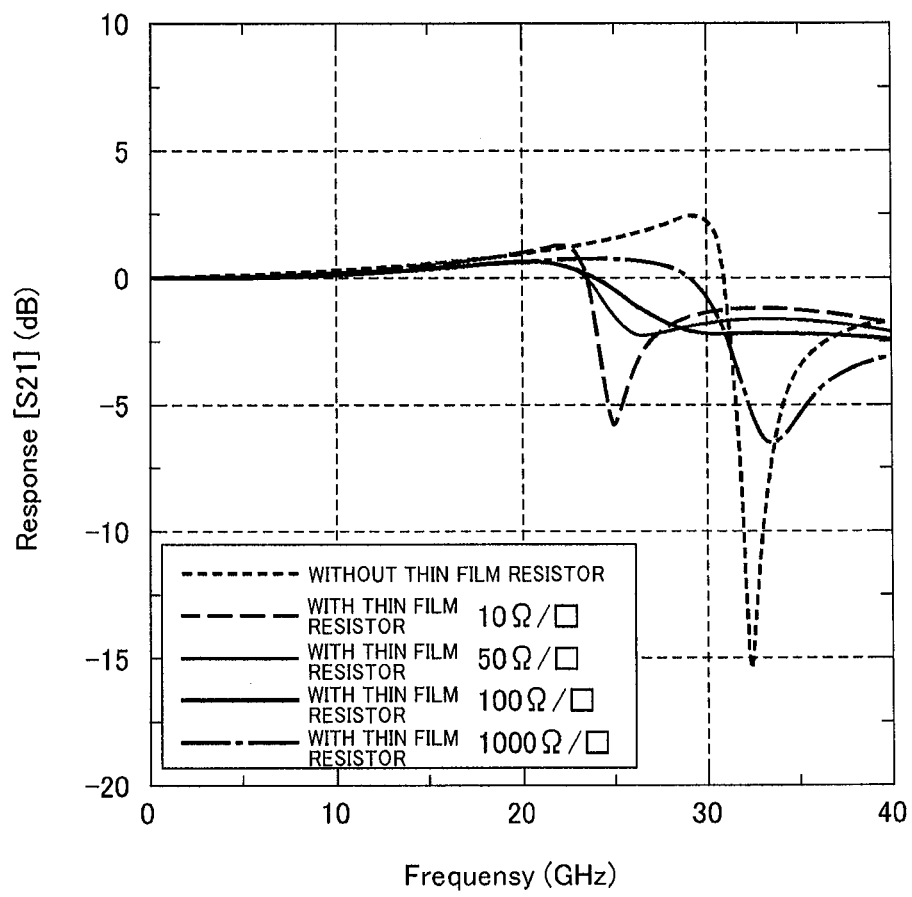
FIG. 12 is a diagram verifying the effects of a resistance value of the thin film resistor according to this embodiment.

FIG. 12 is a diagram verifying the effects of the thin film resistor 315. In this example, in FIG. 12, the axis of ordinate represents a transmission characteristic (S21), and the axis of abscissa represents a frequency. As understood from FIG. 12, when the thin film resistor 315 is not provided, a sharp dip appears in the periphery of 32.4 GHz. That is, it is found that the electromagnetic wave near this frequency moves away from the bias pads 306, and flies out toward the air.

However, it is found that when the thin film resistor 315 is provided, the transmission characteristic degradation is improved, as compared with a case in which the thin film resistor 315 is not provided. Specifically, when the transmission characteristic degradation is improved when the thin film resistor 315 of 10 Ω/cm² (10Ω in square of 1 cm) to 1000 Ω/cm² is provided. More specifically, when the thin film resistor 315 of 50 Ω/cm² (50Ω in square of 1 cm) to 100 Ω/cm² is provided, dipping or peaking hardly occurs, and the flatter transmission characteristic can be realized.

Figure 13:
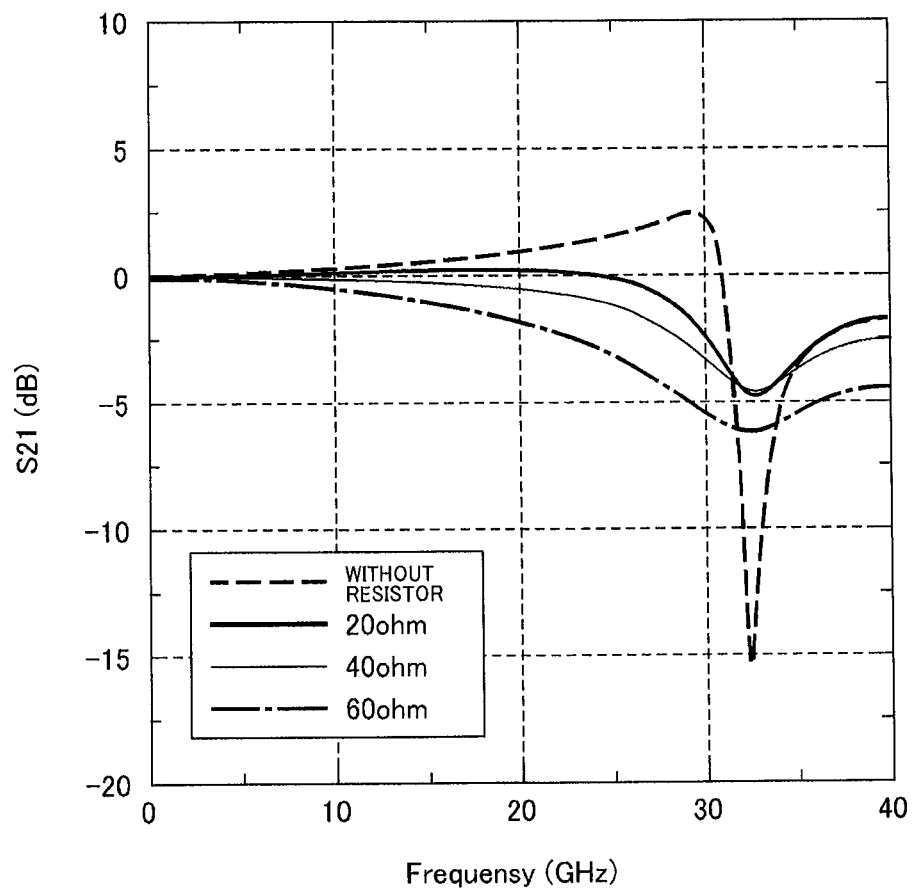
FIG. 13 is a diagram illustrating a transmission characteristic when a resistance pattern is disposed in series with the bias pad as a comparative example of this embodiment.

FIG. 13 is a diagram illustrating the transmission characteristic when a resistance pattern is disposed in series with the bias pad as a comparative example with this embodiment. As illustrated in FIG. 13, it is found that the resonance dip at 32.4 GHz is small when a resistance value of the resistance patterns 316 is 20Ω to 60Ω. However, in this case, as understood from a comparison with the case illustrated in FIG. 12, it is found that the transmission characteristic is degraded (lowered) in a frequency band of 20 GHz or lower. That is, when the resistance patterns 316 are inserted in series with the bias pads 306, the cutoff frequency drops according to the above Expression (1). This is insufficient as the performance of the optical receiver module which is used in the high speed optical fiber communication broad in the transmission band. On the contrary, according to one or more embodiments of the present invention, as understood from a comparison between FIGS. 12 and 13, the transmission characteristic can be more flattened in both of the frequency band of 30 GHz or lower and the frequency band higher than 30 GHz.

The resistance value used in the thin film resistor 315 is different depending on the shape, size and position of the bias pads 306. For example, a range from a small resistance value of about 10 $\Omega/cm^2$ to a resistance value of about 1000 $\Omega/cm^2$ is reasonable in manufacturing.

The present invention is not limited to the above embodiment, but may be replaced with substantially the same configuration as that shown in the above embodiment, a configuration having the same advantages, or a configuration that can achieve the same object.

Figure 14:
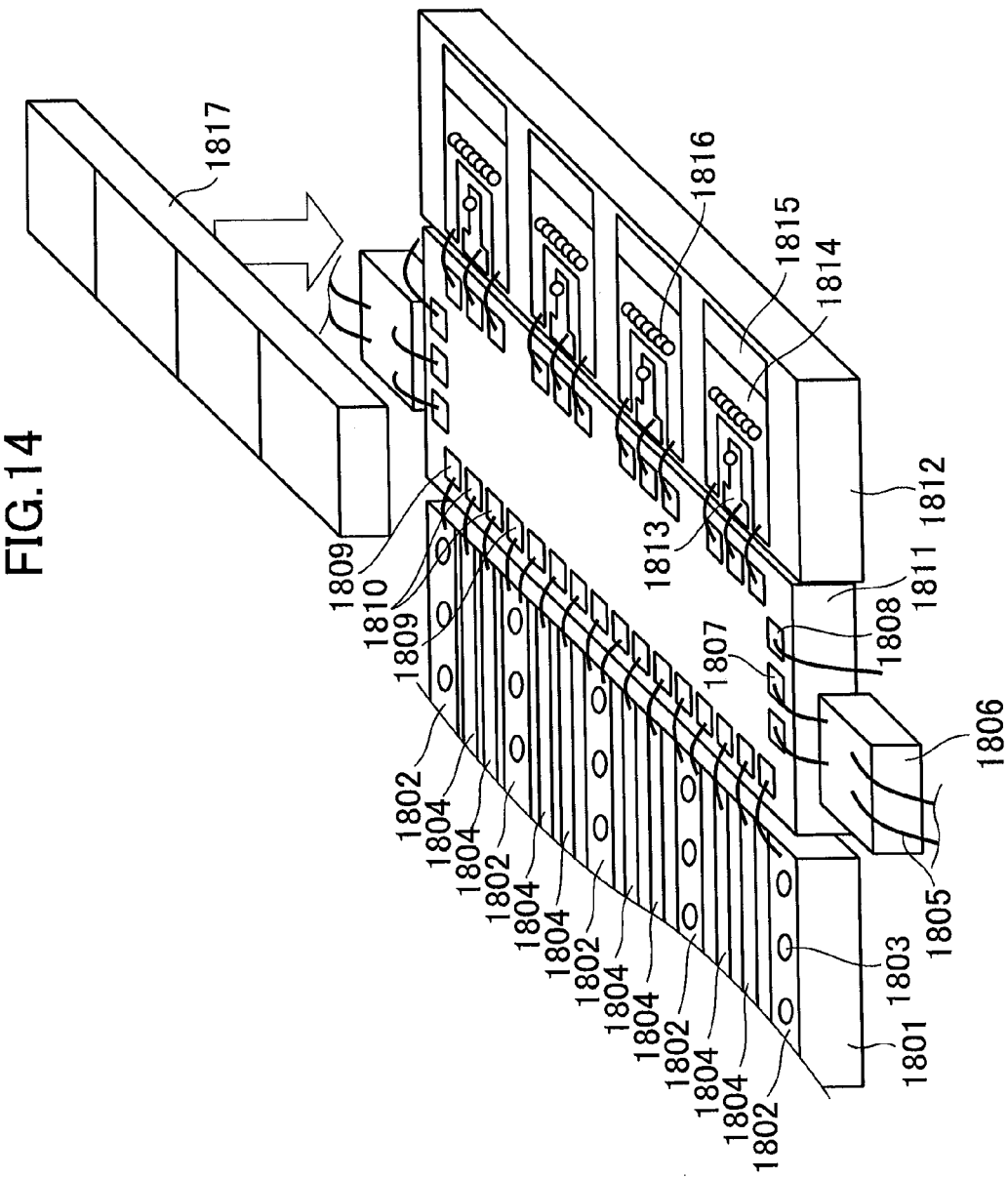
FIG. 14 is a diagram illustrating an appearance applied to a four-channel optical receiver module.

Specifically, for example, as illustrated in FIG. 14, the optical receiver module 100 may be configured as a 4-channel optical receiver module. Specifically, as illustrated in FIG. 14, an array light receiving element 1817 has an absorption layer of 4 channels, and has a signal pad (not shown) and a bias pad (not shown) in the respective channels. As in the above description, the respective pads of the array light receiving element 1817 are mounted on signal pads 1813 and bias pads 1814 on a carrier 1812 by solders 1816. The bias pads 1814 on the carrier 1812 are independent from each other in the respective channels in FIG. 14, but may be commonalized in all of the channels.

Also, as in the above description, in the bias pad 1814 of each channel, a thin film resistor 1815 is configured to contact with an outer periphery of the bias pad 1814. With the above configuration, the resonance of the bias pads 1814 on the carrier 1812 can be prevented. The details will be omitted from the description since the configuration is identical with that of the optical receiver module 100.

In the array light receiving element 1817, the light signal is converted into the electric signal, and amplified and output in each channel in a transimpedance amplifier 1811. As pads for outputting the signal, two differential signal pads 1810 are provided between two GND pads 1809. This alignment of the output pads is called "GSSG structure". Referring to FIG. 14, a bias of the array light receiving element 1817 is supplied from the transimpedance amplifier 1811, but may be supplied from the external not through the transimpedance amplifier 1811. In this case, the bias pads 1814 may be independent from each other for each channel, or may be partially commonalized.

Second Embodiment

Subsequently, a second embodiment of the present invention will be described. This embodiment is different from the first embodiment mainly in that the bias power to be supplied to a bias pad 413 is supplied from the external through a wire 407 and a flat capacitor 409. Configurations identical with those in the first embodiment will be omitted from the following description.

Figure 15:
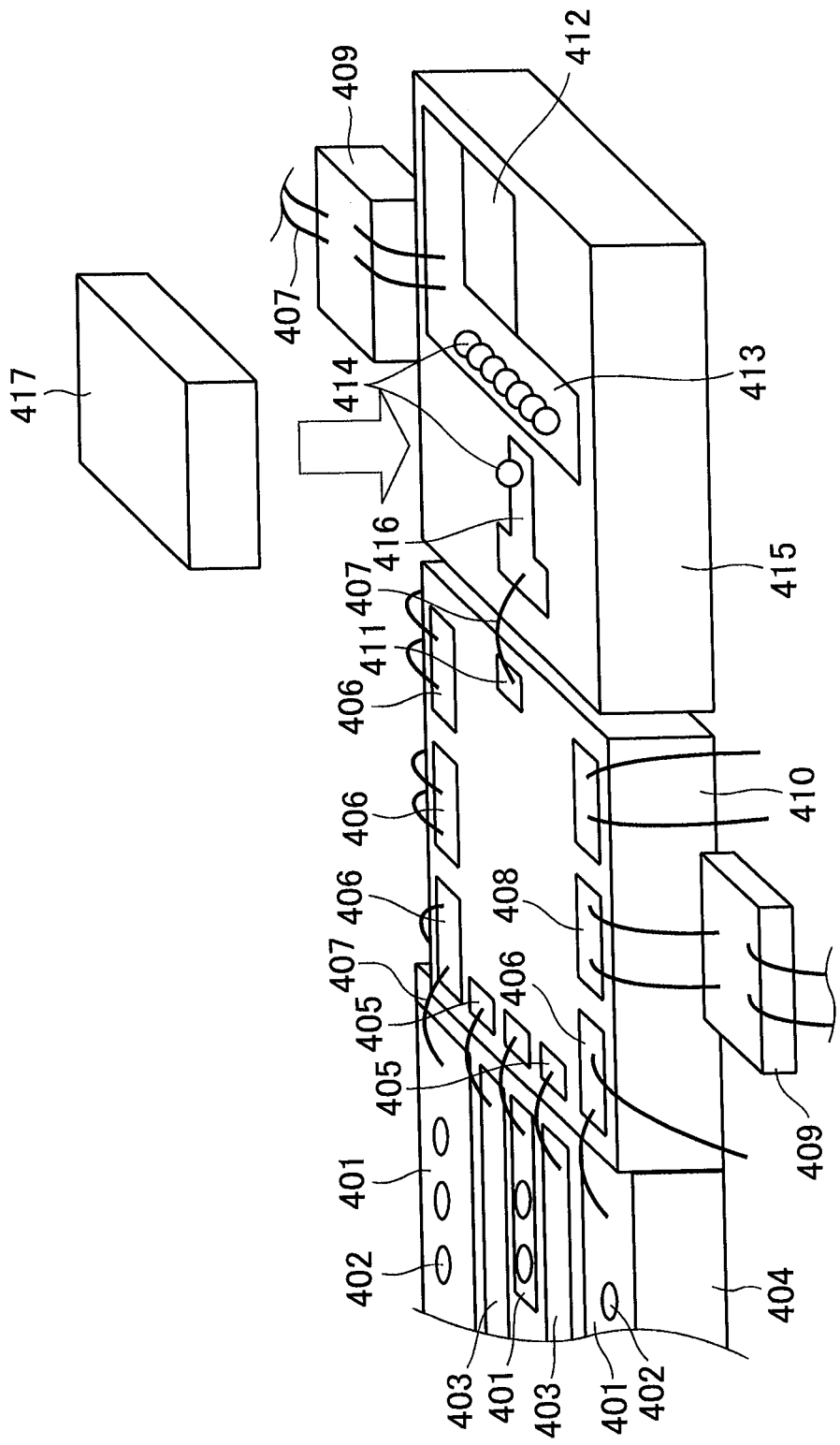
FIG. 15 is a diagram illustrating a second embodiment of the present invention.

FIG. 15 is a diagram illustrating the second embodiment of the present invention. As illustrated in FIG. 15, the bias power to be supplied to the bias pad 413 is not supplied from pads of a transimpedance 410, but supplied from the external through the electrodes on the wire 407 and the flat capacitor 409.

Also, as in the above first embodiment, a thin film resistor 412 is disposed in a part of the outer periphery of the bias pad 413. Specifically, for example, in this embodiment, the bias pad 413 has an L-shaped configuration, and the thin film resistor 412 is disposed to contact with two sides of an outer periphery of the bias pad 413 at an opposite side to a signal pad 416. The shape of the bias pad 413 is exemplary, and is not limited to this configuration.

Further, as in the first embodiment, when a light signal of a given frequency is input to a light receiving element 417, and a current corresponding to that frequency is drawn from the bias pad 413, if the current has DC to several GHz hardly affected by the skin effect, the current flows in the overall bias pad 413, and is not affected by the thin film resistor 412. However, if the current becomes a high frequency of several GHz or higher, a current density is localized in an edge of the bias pad 413, and slightly passes through the interior of the thin film resistor 412. For that reason, the resonance at the bias pad 413 is suppressed, and the occurrence of electromagnetic field radiation from the bias pad 413 can be prevented.

The present invention is not limited to the above first and second embodiments, but may be replaced with substantially the same configuration as that shown in the above embodiments, a configuration having the same advantages, or a configuration that can achieve the same object.

Third Embodiment

Figure 16:
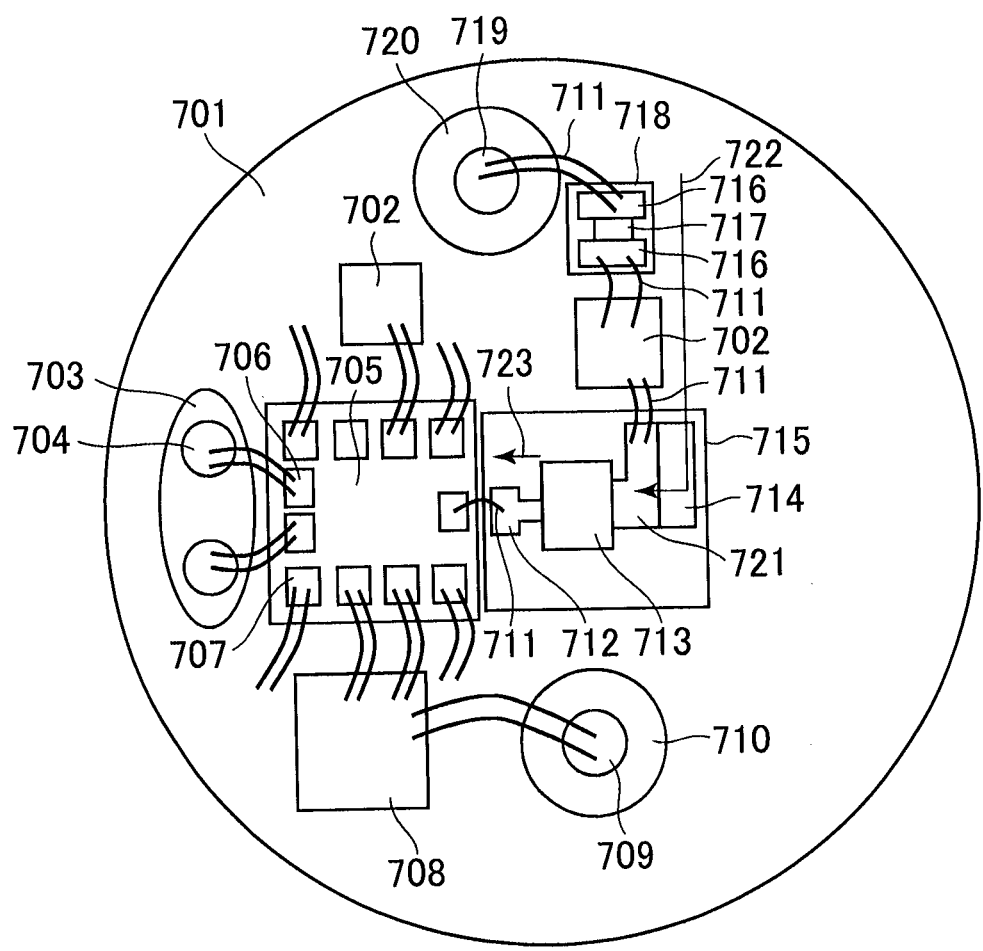
FIG. 16 is a diagram illustrating a third embodiment of the present invention.

FIG. 16 is a diagram illustrating a third embodiment of the present invention. This embodiment is different from the second embodiment mainly in that the optical receiver module is a so-called "package substrate 701". Configurations identical with those in the second embodiment will be omitted from the following description.

Specifically, FIG. 16 is a diagram illustrating an outline of a transimpedance amplifier 705 and a carrier 715 when viewed from above. As illustrated in FIG. 16, the package substrate 701 is generally also called "stem", and has a coaxial shape. The package substrate 701 is known as a CAN type package. The package substrate 701 is made of, for example, kovar, ion, SUS, or CuW which plated with gold.

A bias power to a light receiving element 713 and the power supply to the transimpedance amplifier 705 are supplied from the external by lead pins 709 and 719. Also, an electric signal output from the transimpedance amplifier 705 is output to the external of the optical receiver module by signal pins 704.

The light receiving element 713 may be air-tightly sealed for the purpose of preventing an influence of humidity and dust from an outside air. In this case, a cap with a lens is mounted on the package substrate 701 by welding. Also, dielectrics 703, 710, and 720 are made of, for example, inorganic material excellent in airtightness such as glass or ceramic.

A filter resistance substrate 718 and a flat capacitor 702 are mounted on the bias power. The flat capacitor 702 reduces noise entering the light receiving element 713 from the external through the bias pin 719.

In this example, as in the first and second embodiments, because wires 711 are provided between the flat capacitor 702 and a bias pad 721, the potential is slightly displaced particularly in a high frequency band. For that reason, the bias pad 721 on the carrier 715 is liable to resonate at a specific frequency according to the dimensions and the shape thereof. When the bias pad 721 resonates, the electromagnetic field is radiated from the bias pad 721 into a space of the optical receiver module. When an electromagnetic noise is input from the signal or the power pad on the transimpedance amplifier 705, and amplified and output, the performance of the optical receiver module is remarkably degraded.

Under the circumstances, in this embodiment, as in the above first and second embodiments, a thin film resistor 714 is formed to contact with an outer periphery of the bias pad 721. With the above configuration, the electromagnetic noise emission by resonance can be suppressed.

Figure 17:
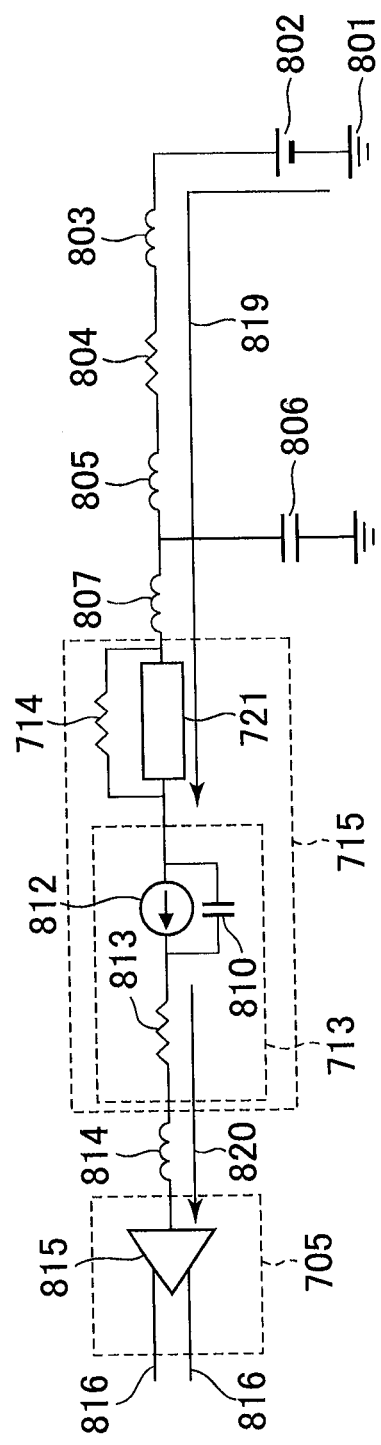
FIG. 17 is a diagram illustrating an outline of an equivalent circuit of a configuration illustrated in FIG. 16.

FIG. 17 is a diagram illustrating an outline of an equivalent circuit of a configuration illustrated in FIG. 16. As in the first embodiment, the light receiving element 713 is represented by an inner resistor 813, a current source 812, and an internal capacitor 810. Also, since this embodiment is identical with the first embodiment in that the wires 711 are represented by a wire inductance 814, a detailed description thereof will be omitted.

As illustrated in FIG. 17, the light receiving element 713 is mounted on the carrier 715, and the wire inductance 814 is arranged between the carrier 715 and the transimpedance amplifier 705. In this configuration, a flat capacitor 806 and a filter resistor 804 prevent noise entering from a bias power 802 which is provided at outside of the optical receiver module.

However, in the high frequency area, a potential of the flat capacitor 806 does not slightly match a potential of the bias pad 721. For that reason, the bias pad 721 is liable to resonate at a given frequency. However, as in the first embodiment, since the thin film resistor 714 is connected in parallel to the bias pad 721, the resonance efficiency is degraded, and the electromagnetic field noise radiation is suppressed.

The present invention is not limited to the above first to third embodiments, but may be replaced with substantially the same configuration as that shown in the above embodiments, a configuration having the same advantages, or a configuration that can achieve the same object.

Fourth Embodiment

Figure 18:
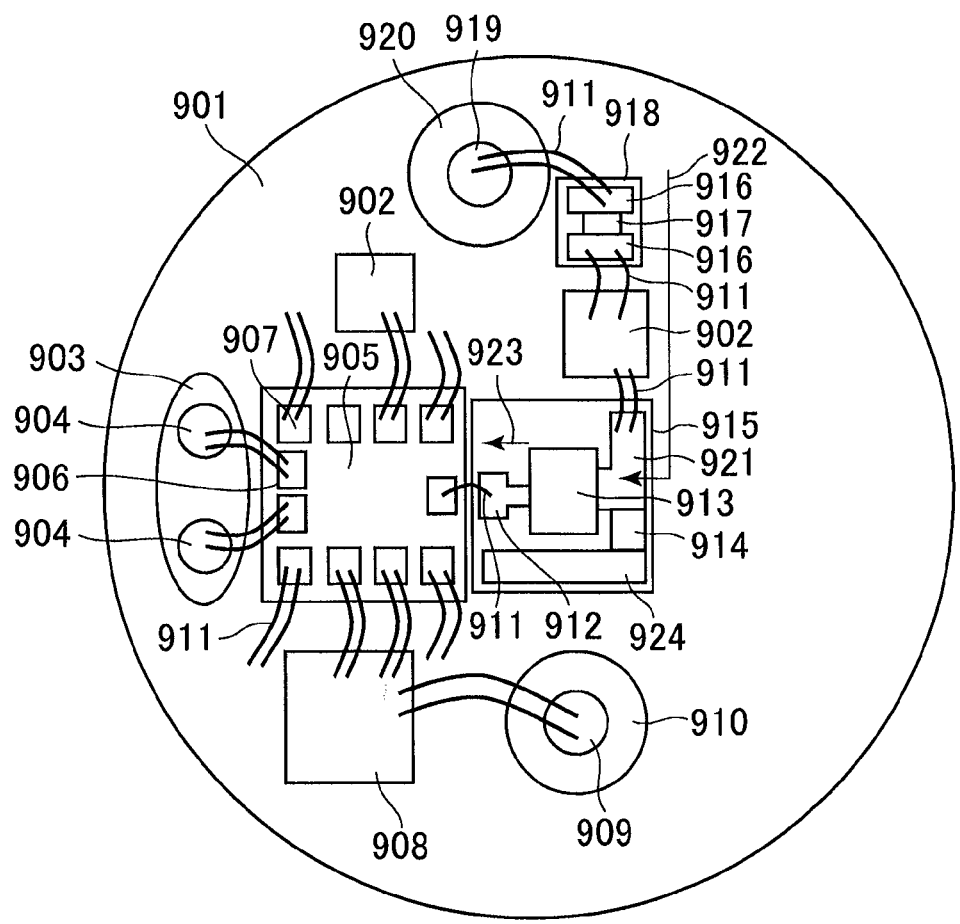
FIG. 18 is a diagram illustrating a fourth embodiment of the present invention.

FIG. 18 is a diagram illustrating a fourth embodiment of the present invention. This embodiment is different from the third embodiment mainly in that a pad that contacts with the thin film resistor is disposed in addition to the bias pad. Configurations identical with those in the third embodiment will be omitted from the following description.

As illustrated in FIG. 18, a thin film resistor 914 is disposed to contact with a part of an outer periphery of a bias pad 921 on a carrier 915. In this embodiment, a pad 924 is further formed to contact with the thin film resistor 914 and to be in out of contact with the bias pad 921.

In this example, the pad 924 is set to be lower in resistance value than the thin film resistor 914. Specifically, for example, the pad 924 is plated with gold which is set to be, for example, 0.1Ω or lower, for allowing DC to flow into the pad 924.

Figure 19:
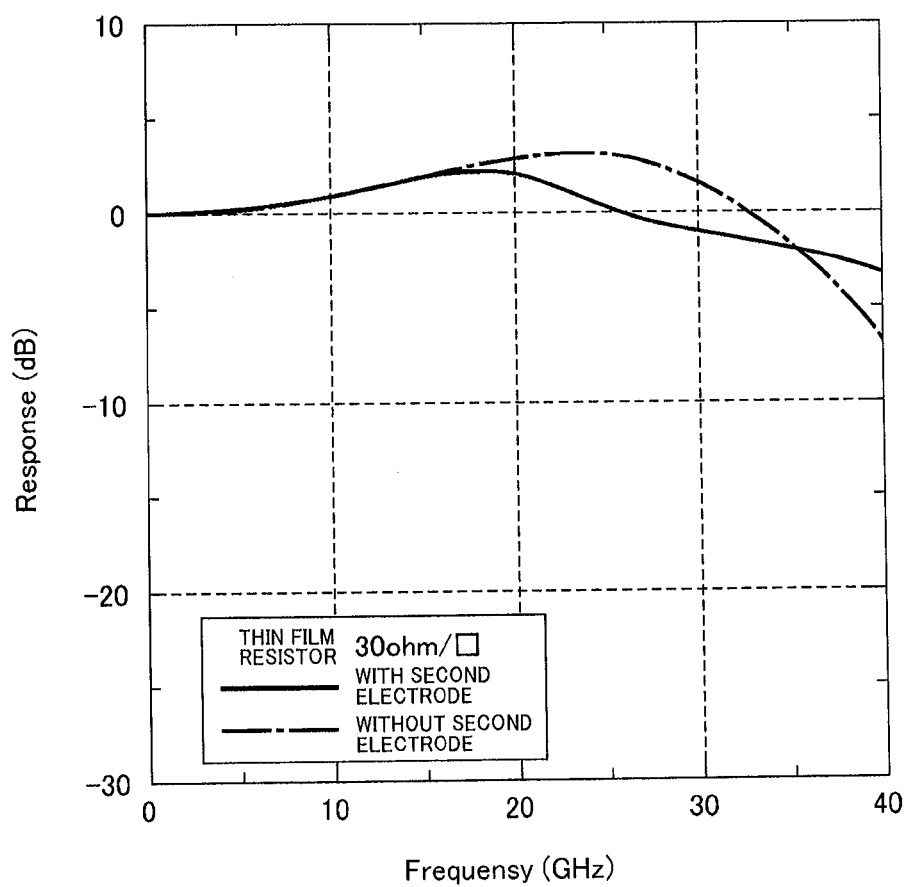
FIG. 19 is a diagram illustrating the effects of this embodiment.

FIG. 19 is a diagram illustrating simulation results for describing the effects of this embodiment. Specifically, FIG. 19 illustrates a relationship between the transmission characteristic and the frequency in a case where the pad 924 is provided, and in a case where the pad 924 is not provided, when the thin film resistor 914 of 30 $\Omega/cm^2$ is provided. As is understood from FIG. 19, in the case where the pad 924 is provided, the transmission characteristic can be more flattened than the case where the pad 924 is not provided. The same description as that in the first embodiment such that the axis of abscissa represents the frequency, and so on will be omitted. Also, in FIG. 19, the pad 924 is indicated as a second electrode.

Figure 20:
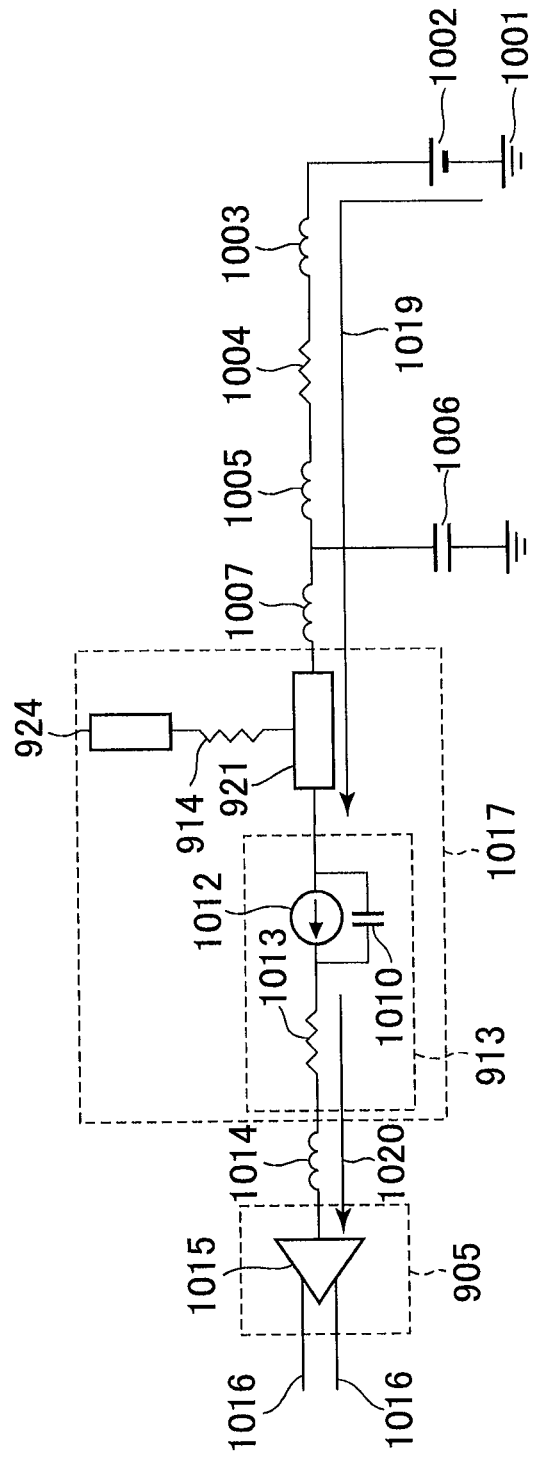
FIG. 20 is a diagram illustrating an outline of an equivalent circuit of an optical receiver module illustrated in FIG. 18.

FIG. 20 is a diagram illustrating an outline of an equivalent circuit of the optical receiver module illustrated in FIG. 18. As illustrated in FIG. 20, the pad 924 is arranged through the thin film resistor 914 on the bias pad 921 disposed on a carrier 1017.

In this example, as in the first to third embodiments, when the light signal is input to a light receiving element 913, a current source 1012 tries to draw a current along a current path 1019. If the current is a low frequency of DC to several GHz, the current is not affected by the thin film resistor 914 or the pad 924.

However, when the current becomes several GHz or higher, the current is affected by the thin film resistor 914 or the pad 924. That is, the thin film resistor 914 and the pad 924 are arranged in parallel to the bias pad 921, and the current flows in the thin film resistor 914 and the pad 924. The details of the effects by the influence have been described above with reference to FIG. 19.

According to this embodiment, a probe is pressed against a signal pad 912 and the pad 924, thereby being capable of inspecting the DC characteristic and the high frequency characteristic of the light receiving element 913.

The present invention is not limited to the above first to fourth embodiments, but may be replaced with substantially the same configuration as that shown in the above embodiments, a configuration having the same advantages, or a configuration that can achieve the same object.

Fifth Embodiment

Subsequently, a fifth embodiment of the present invention will be described. This embodiment is different from the fourth embodiment mainly in that a thin film resistor connected in series with the bias pad is disposed, in addition to the provision of the thin film resistor connected in parallel to the bias pad, and the pad contacting with the thin film resistor as in the fourth embodiment. The same configurations as those in the fourth embodiment will be omitted.

Figure 21:
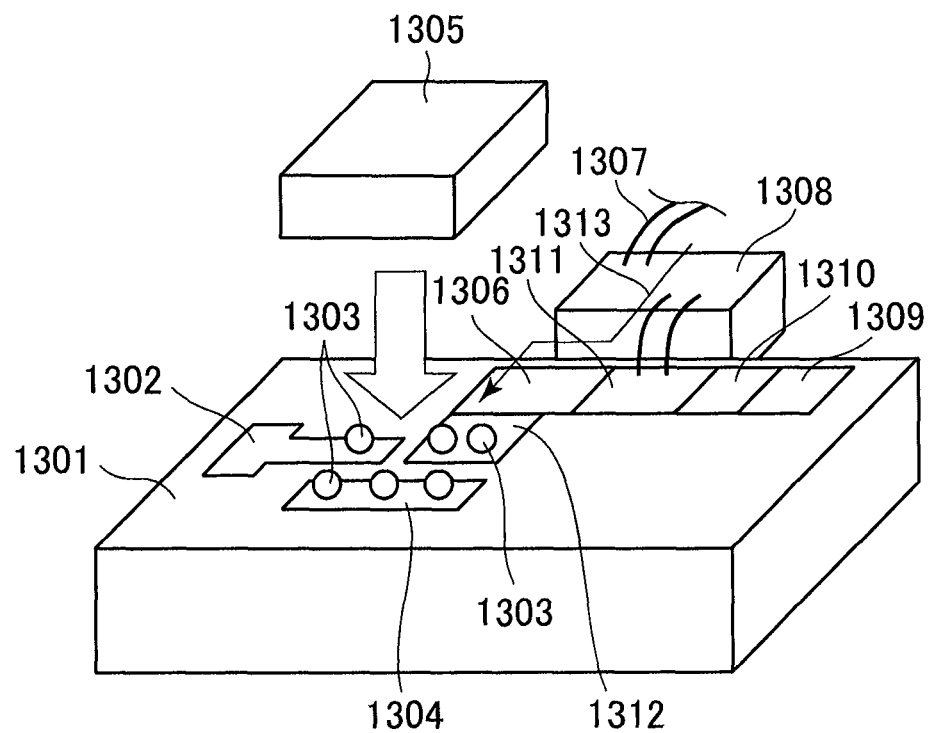
FIG. 21 is a diagram illustrating a fifth embodiment of the present invention.

FIG. 21 is a diagram illustrating the fifth embodiment of the present invention. Specifically, FIG. 21 is a perspective view illustrating an outline of the optical receiver module according to this embodiment. Also, FIG. 22 is a plan view taken from a rear surface (surface at a side where a carrier 1301 is installed) of a light receiving element 1305.

Figure 22:
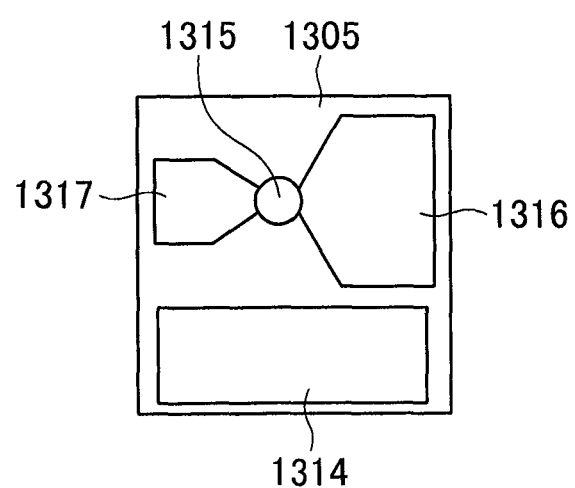
FIG. 22 is a diagram viewed from a rear surface of a light receiving element in FIG. 21.

As illustrated in FIGS. 21 and 22, a signal pad 1317, a bias pad 1316, and a solder pad 1314 on the light receiving element 1305 are mounted in a signal pad 1302, a bias pad 1312, and a solder pad 1304 by solders 1303, respectively. The solder pad 1304 is configured to enhance an adhesive strength of the light receiving element 1305 and the carrier 1301.

A bias power to the light receiving element 1305 is supplied to a bias pad 1311 from the external through a wire 1307 and a pad on a flat capacitor 1308. That is, the current of DC to several GHz, which is input from the external, is supplied to the bias pad 1311 as indicated by a current path 1313.

In this embodiment, a first thin film resistor 1306 is arranged between the bias pad 1311 and the bias pad 1312. That is, the first thin film resistor 1306 is disposed in series with the bias pad 1311 and the bias pad 1312 along the current path 1313. Therefore, the current of all frequencies passes through the first thin film resistor 1306. For that reason, the cutoff frequency can be reduced. As a result, according to this embodiment, the first thin film resistor 1306 is disposed at a given position with a given shape, thereby being capable of providing the optical receiver module having a desired performance.

Also, as in the above fourth embodiment, a second thin film resistor 1310 is disposed to contact with the bias pad 1311, and a pad 1309 is also disposed to contact with the second thin film resistor 1310. Because the second thin film resistor 1310 and the pad 1309 are not provided in the current path 1313, DC to several GHz is hardly affected. However, the effects are exerted in several GHz or higher, and the resonance is suppressed according to the sizes and shapes of the thin film resistor 1310 and the pad 1309.

As described above, according to this embodiment, there can be provided the optical receiver module having the desired performance in addition to the effects of the above fourth embodiment.

The present invention is not limited to the above first to fifth embodiments, but may be replaced with substantially the same configuration as that shown in the above embodiments, a configuration having the same advantages, or a configuration that can achieve the same object.

Figure 23:
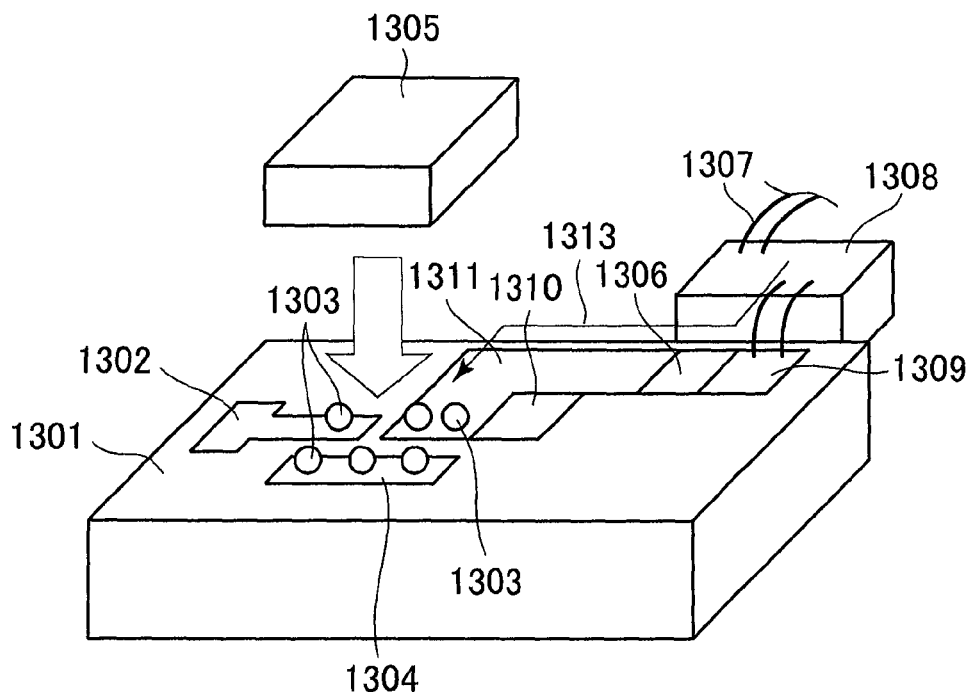
FIG. 23 is a diagram illustrating an example in which a second resistance thin film is disposed at a different position.

For example, the second thin film resistor 1310 may be disposed at a position illustrated in FIG. 23. In this case, as in the above configuration, the bias power to the light receiving element 1305 is supplied through the wire 1307 and the pad on the flat capacitor 1308. A current of a relatively low frequency such as DC to several GHz flows along a path of the first thin film resistor 1306 and the bias pad 1311, that is, the current path 1313. The first thin film resistor 1306 in which the current of all the frequencies flows lowers the cutoff frequency. Then, when the frequency becomes a high frequency of several GHz or higher, a part of current flowing into the bias pad 1311 also flows into the second thin film resistor 1310. For that reason, the resonance can be suppressed in the bias pad 1311. That is, there can be provided the optical receiver module having a desired performance by the position and combination of the first thin film resistor 1306 and the second thin film resistor 1310 on the bias pad 1311.

Sixth Embodiment

Subsequently, a sixth embodiment of the present invention will be described. This embodiment is different from the first embodiment mainly in that a light receiving element 1504 is disposed on a transimpedance amplifier 1501. Configurations identical with those of the first embodiment will be omitted in the following description.

Figure 24:
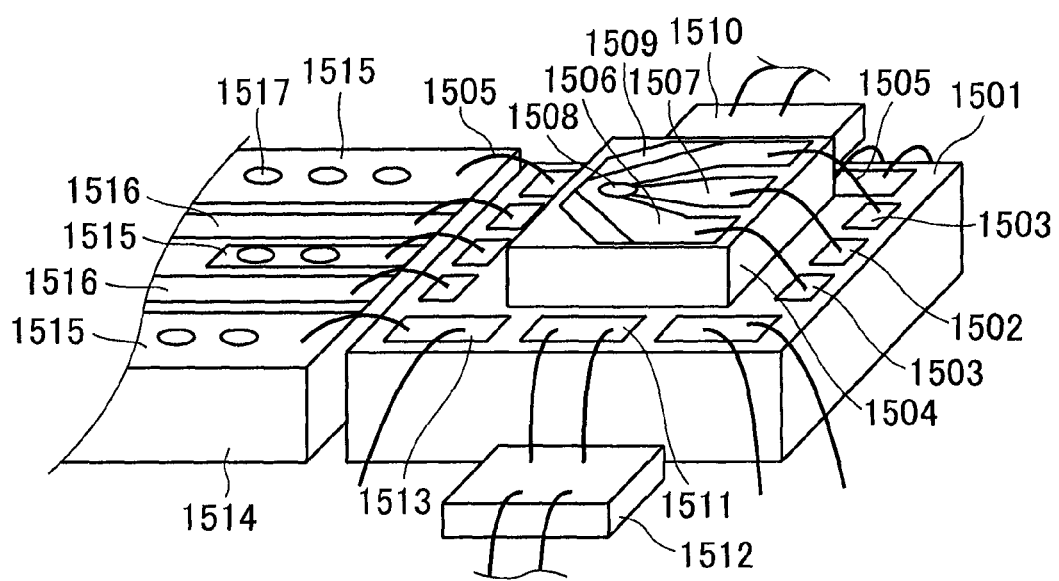
FIG. 24 is a diagram illustrating a sixth embodiment of the present invention.

FIG. 24 is a diagram illustrating an optical receiver module according to this embodiment. As illustrated in FIG. 24, the light receiving element 1504 is fixedly mounted on the transimpedance amplifier 1501 with, for example, an adhesive.

As in the first embodiment, a power of the transimpedance amplifier 1501 is supplied to a power pad 1511 from the external through a wire 1505 and a pad on a flat capacitor 1512. A bias of the light receiving element 1504 is generated or branched from a power supply within the transimpedance amplifier 1501, and supplied to a bias pad 1506 on the light receiving element 1504 from a bias pad 1503.

In this example, the light receiving element 1504 is a front surface illuminated type light receiving element where an absorption layer 1508 is located on a front surface (upper side of FIG. 24) thereof. Hence, a signal pad 1507 and the bias pad 1506 are also disposed on a front surface side of the light receiving element 1504.

As in the above first embodiment, a thin film resistor 1509 is arranged to connect in parallel to the bias pad 1506 along an outer periphery of the bias pad 1506. With the above configuration, the resonance at the bias pad 1506 can be suppressed.

The present invention is not limited to the above first to sixth embodiments, but may be replaced with substantially the same configuration as that shown in the above embodiments, a configuration having the same advantages, or a configuration that can achieve the same object. For example, in the above description, the examples using the transimpedance amplifier have been described. Alternatively, amplifiers such as a preamplifier, a limiting amplifier, or an auto-gain controller may be used.

What is claimed is:

1. An optical receiver module, comprising:
   a light receiving element that converts a received light signal into an electric signal;
   a bias pad supplied with a bias power, wherein the bias pad is included in the light receiving element and/or a carrier on which the light receiving element is mounted;
   a thin film resistor arranged in contact with the bias pad so as to connect in parallel to the bias pad, wherein an electric resistance of the thin film resistor is larger than an electric resistance of the bias pad; and
   an amplifier that amplifies the electric signal.

2. The optical receiver module according to claim 1, wherein the thin film resistor is disposed in an outer periphery of the bias pad to contact with the bias pad.

3. The optical receiver module according to claim 1, further comprising a pad arranged to contact with the thin film resistor without contacting with the bias pad, wherein a resistance value of the pad is smaller than a resistance value of the thin film resistor.

4. The optical receiver module according to claim 1, wherein the thin film resistor is arranged so that an end of the bias pad contacts with the thin film resistor.

5. The optical receiver module according to claim 1, wherein the thin film resistor is arranged so that an end of the bias pad overlaps with the thin film resistor.

6. The optical receiver module according to claim 1, wherein the thin film resistor is disposed to contact with the bias pad included in the carrier.

7. The optical receiver module according to claim 1, wherein the thin film resistor is disposed to contact with the bias pad included in the light receiving element.

8. The optical receiver module according to claim 1, wherein the bias power is supplied to the bias pad through a wire.

9. The optical receiver module according to claim 1, wherein the amplifier is any one of a transimpedance amplifier, a preamplifier, a limiting amplifier, and an automatic gain controller.

* * * * *